United States Patent
Lee et al.

(10) Patent No.: US 8,846,465 B2
(45) Date of Patent: Sep. 30, 2014

(54) INTEGRATED CIRCUIT WITH MULTI RECESSED SHALLOW TRENCH ISOLATION

(71) Applicant: Taiwan Semiconductor Manufacturing Company, Ltd., Hsin-Chu (TW)

(72) Inventors: Tsung-Lin Lee, Hsin-Chu (TW); Chang-Yun Chang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/910,757

(22) Filed: Jun. 5, 2013

(65) Prior Publication Data

US 2013/0267075 A1    Oct. 10, 2013

Related U.S. Application Data

(62) Division of application No. 12/838,264, filed on Jul. 16, 2010.

(60) Provisional application No. 61/252,351, filed on Oct. 16, 2009.

(51) Int. Cl.
*H01L 21/337* (2006.01)
*H01L 21/762* (2006.01)

(52) U.S. Cl.
CPC ........ *H01L 21/762* (2013.01); *H01L 21/76232* (2013.01)
USPC ............ 438/196; 257/506; 257/510; 257/544

(58) Field of Classification Search
USPC ........................... 257/510, 506, 544; 438/196
See application file for complete search history.

(56) References Cited

U.S. PATENT DOCUMENTS

| | | | |
|---|---|---|---|
| 6,706,571 B1 | 3/2004 | Yu et al. | |
| 6,858,478 B2 | 2/2005 | Chau et al. | |
| 7,190,050 B2 | 3/2007 | King et al. | |
| 7,208,390 B2 | 4/2007 | Singh et al. | |
| 7,247,887 B2 | 7/2007 | King et al. | |
| 7,265,008 B2 | 9/2007 | King et al. | |
| 7,279,376 B2 | 10/2007 | Otuski | |
| 7,352,034 B2 * | 4/2008 | Booth et al. | 257/369 |
| 7,381,649 B2 | 6/2008 | Chen et al. | |
| 7,508,031 B2 | 3/2009 | Liu et al. | |
| 7,528,465 B2 | 5/2009 | King et al. | |

(Continued)

FOREIGN PATENT DOCUMENTS

| | | |
|---|---|---|
| JP | 2005-191331 A | 7/2005 |
| JP | 2006 080492 A | 3/2006 |

(Continued)

*Primary Examiner* — Nicholas Tobergte
(74) *Attorney, Agent, or Firm* — Slater & Matsil, L.L.P.

(57) ABSTRACT

A system and method for forming multi recessed shallow trench isolation structures on substrate of an integrated circuit is provided. An integrated circuit includes a substrate, at least two shallow trench isolation (STI) structures formed in the substrate, an oxide fill disposed in the at least two STI structures, and semiconductor devices disposed on the oxide fill in the at least two STI structures. A first STI structure is formed to a first depth and a second STI structure is formed to a second depth. The oxide fill fills the at least two STI structures, and the first depth and the second depth are based on semiconductor device characteristics of semiconductor devices disposed thereon.

20 Claims, 8 Drawing Sheets

(56) References Cited

U.S. PATENT DOCUMENTS

| | | |
|---|---|---|
| 7,605,449 B2 | 10/2009 | Liu et al. |
| 7,635,899 B2 | 12/2009 | Yang et al. |
| 7,709,347 B2 * | 5/2010 | Sakagami .................... 438/424 |
| 2005/0153490 A1 | 7/2005 | Yoon et al. |
| 2006/0046407 A1 * | 3/2006 | Juengling .................... 438/301 |
| 2007/0120156 A1 | 5/2007 | Liu et al. |
| 2007/0122953 A1 | 5/2007 | Liu et al. |
| 2007/0122954 A1 | 5/2007 | Liu et al. |
| 2007/0128782 A1 | 6/2007 | Liu et al. |
| 2007/0132053 A1 | 6/2007 | King et al. |
| 2008/0217720 A1 | 9/2008 | Fan et al. |
| 2008/0290470 A1 | 11/2008 | King et al. |
| 2008/0296632 A1 | 12/2008 | Moroz et al. |
| 2009/0181477 A1 | 7/2009 | King et al. |
| 2010/0252870 A1 | 10/2010 | Lin et al. |

FOREIGN PATENT DOCUMENTS

| | | |
|---|---|---|
| JP | 2006 164998 A | 6/2006 |
| JP | 2007 013074 A | 1/2007 |
| JP | 2007 189224 A | 7/2007 |
| TW | I297525 B | 6/2008 |

* cited by examiner

INTEGRATED CIRCUIT WITH MULTI RECESSED SHALLOW TRENCH ISOLATION

This application is a divisional of U.S. patent application Ser. No. 12/838,264, entitled "Integrated Circuit with Multi Recessed Shallow Trench Isolation," filed on Jul. 16, 2010, which application claims the benefit of U.S. Provisional Patent Application Ser. No. 61/252,351, filed on Oct. 16, 2009, and entitled "Integrated Circuit with Multi Recessed Shallow Trench Isolation," both of which applications are incorporated herein by reference.

TECHNICAL FIELD

The present invention relates generally to integrated circuits, and more particularly to a system and method for forming multi recessed shallow trench isolation structures on substrate of an integrated circuit.

BACKGROUND

Generally, shallow trench isolation (STI) helps to prevent electrical current leakage between adjacent semiconductor devices. In STI, one or more trenches, i.e., the shallow trenches, may be etched into a surface of a substrate and then filled with a dielectric material, such as silicon dioxide. The trenches may be used to isolate semiconductor devices that may then be formed in the trenches. The dielectric material may help to reduce electrical current leakage between adjacent semiconductor devices within the same trench or across different trenches.

Due to electric field enhancement at edges of the trenches, it may be easier to form a conducting channel at a lower voltage. This may effectively reduce the threshold voltage ($V_T$) of the semiconductor devices in the integrated circuit. Therefore, STI has become a widely used technique for improving integrated circuit performance in complementary metal oxide semiconductor (CMOS) integrated circuits.

SUMMARY

These and other problems are generally solved or circumvented, and technical advantages are generally achieved, by embodiments of a system and method for forming multi recessed shallow trench isolation structures on substrate of an integrated circuit.

In accordance with an embodiment, an integrated circuit is provided. The integrated circuit includes a substrate, at least two shallow trench isolation (STI) structures formed in the substrate, an oxide fill disposed in the at least two STI structures, and semiconductor devices disposed on the oxide fill in the at least two STI structures. A first STI structure is formed to a first depth and a second STI structure is formed to a second depth. The oxide fill fills the at least two STI structures, and the first depth and the second depth are based on semiconductor device characteristics of semiconductor devices disposed thereon.

In accordance with another embodiment, a method for forming shallow trench isolation (STI) structures is provided. The method includes applying a first photoresist layer on a substrate, patterning the first photoresist layer with a first pattern, and etching the first STI structure into the substrate. The first pattern is used to create a first STI structure at a first depth. The method also includes applying a second photoresist layer on the substrate, patterning the second photoresist layer with a second pattern, etching the second STI structure into the substrate, and planarizing the substrate. The second pattern is used to create a second STI structure at a second depth.

In accordance with another embodiment, a method for forming shallow trench isolation (STI) structures is provided. The method includes applying a first photoresist layer on a substrate, patterning the first photoresist layer with a first pattern, wherein the first pattern is used to form all STI structures on the substrate, and etching all the STI structures into the substrate to a first depth. The method also includes applying a second photoresist layer on the substrate, patterning the second photoresist layer with a second pattern, wherein the second pattern is used to deepen a first subset of the STI structures to a second depth, etching the first subset of the STI structures to the second depth, and planarizing the substrate.

An advantage of an embodiment is that different STI structure depths may be used for different semiconductor devices. The use of different STI structure depths may allow for optimization of the junction isolation for different semiconductor devices in an integrated circuit.

A further advantage of an embodiment is that different STI structure depths may narrow the gap fill window and CMP process window.

Yet another advantage of an embodiment is that STI stress may be relaxed.

The foregoing has outlined rather broadly the features and technical advantages of the present invention in order that the detailed description of the embodiments that follow may be better understood. Additional features and advantages of the embodiments will be described hereinafter which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The embodiments will be described in a specific context, namely a CMOS integrated circuit having several different circuit types integrated on to a substrate. The embodiments may also be applied, however, to CMOS integrated circuits having a single circuit type integrated onto the substrate. Additionally, the embodiments may be applied to integrated circuit types other than CMOS, such as NMOS, PMOS, and so forth, integrated circuits.

Figure 1:
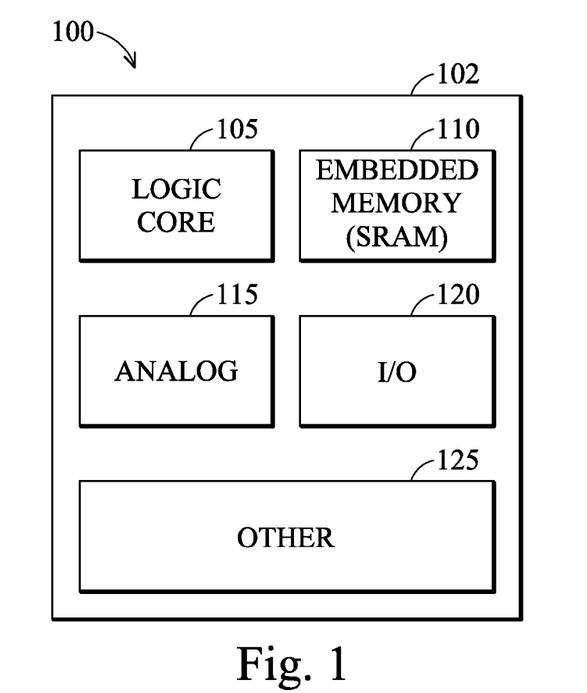
FIG. 1 is a top view of an integrated circuit.

FIG. 1 illustrates a top view of an integrated circuit 100. Integrated circuit 100 includes a semiconductor substrate 102. Semiconductor substrate 102 may be made from a variety of materials, including silicon. Integrated circuits may be created on a top surface of substrate 102. In a typical integrated circuit 100, a variety of integrated circuit types may be created on substrate 102. In general, the different integrated circuit types may be grouped in close proximity of one another to simplify design as well as signal routing, device placement, fabrication, and so forth.

For example, integrated circuit 100 may include a logic core 105, embedded memory 110, analog circuitry 115, input/output (I/O) circuitry 120, other circuitry 125, and so forth. Logic core 105 may provide logical functionality and control, embedded memory 110 may include synchronous random access memory (SRAM), read-only memory (ROM), and so forth, and may be used to store data and applications, analog circuitry 115 may include amplifiers, filters, signal processors, and so on, and may be used to provide analog signal processing and conversion. I/O circuitry 120 may be used to control input/output of signals in and out of integrated circuit 100, while other circuitry 125 may amalgamate circuitry in integrated circuit 100 not directly conforming to the above listed circuit types.

Figure 2:
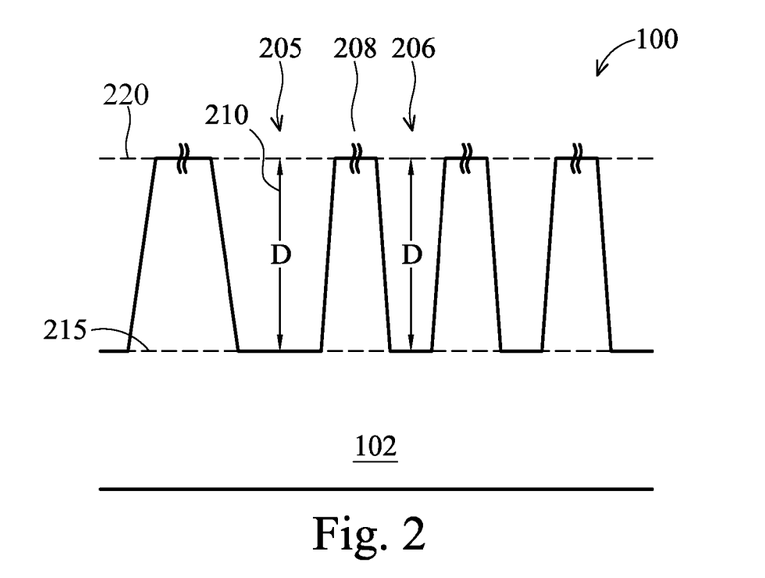
FIG. 2 is a side, cross-sectional view of a substrate of an integrated circuit.

FIG. 2 illustrates a side, cross-sectional view of substrate 102 of integrated circuit 100. The side, cross-sectional view of substrate 102 shows a number of shallow trenches, such as shallow trench 205 and shallow trench 206, formed in substrate 102. Although not shown, the shallow trenches may be filled with a dielectric, such as silicon dioxide, and semiconductor devices may then be created on the top surface of the dielectric in the shallow trenches.

In general, a circuit may be formed in its entirety on substrate 102 between a pair of shallow trenches, a portion of a circuit may be formed on substrate 102 between a pair of shallow trenches and a portion of the circuit may be formed on a shallow trench, a portion of a circuit may be formed on substrate 102 between a first pair of shallow trenches and a portion of the circuit may be formed on substrate 102 between a second pair of shallow trenches with or without a portion of the circuit formed on a shallow trench, and so forth. Although a significant majority of semiconductor devices may be formed on substrate 102 between pairs of shallow trenches, some semiconductor devices (or structures) may be formed on the fill of the shallow trenches themselves. For example, semiconductor devices may be formed on the fill of the shallow trenches to connect semiconductor devices formed on substrate 102 between pairs of shallow trenches.

The cross-sectional view of substrate 102 is not drawn to scale, with the dimensions of the shallow trenches being exaggerated while the dimensions of portions of substrate 102 wherein semiconductor devices may be formed de-emphasized. For example, substrate surface 208 (between shallow trench 205 and shallow trench 206) is shown in abbreviated form in FIG. 2. The exaggeration of dimensions is used in subsequent diagrams of cross-sectional views of substrates presented below.

Typically, the shallow trenches may be created in substrate 102 early on in a fabrication process, wherein a pattern for the shallow trenches may be formed on the top surface of substrate 102 and the shallow trenches may be etched into substrate 102. After the shallow trench is created, a dielectric material may be used to fill the shallow trenches. Then, a polishing operation, using chemical mechanical polish (CMP) planarization for example, to planarize the top surface of substrate 102 may be performed. The fabrication process of integrated circuit 100 may then continue to completion.

A depth D of a shallow trench (shown as interval 210 in FIG. 2) may be defined as a distance from a bottom of the shallow trench (shown as dashed line 215) to the top surface of substrate 102 (shown as dashed line 220). As shown in FIG. 2, the shallow trenches have a substantially consistent depth D. The depth D of the shallow trenches may be substantially consistent, independent of the dimensions of the shallow trenches. For example, shallow trench 205 may be wider than shallow trench 206, but both shallow trench 205 and shallow trench 206 may have substantially equal depth D.

The use of a single depth for the various shallow trenches may make it difficult to design junction isolation for different semiconductor devices in an integrated circuit. Similarly, the use of the single depth for the various shallow trenches may narrow the gap fill window and the CMP process window.

Figure 3A:
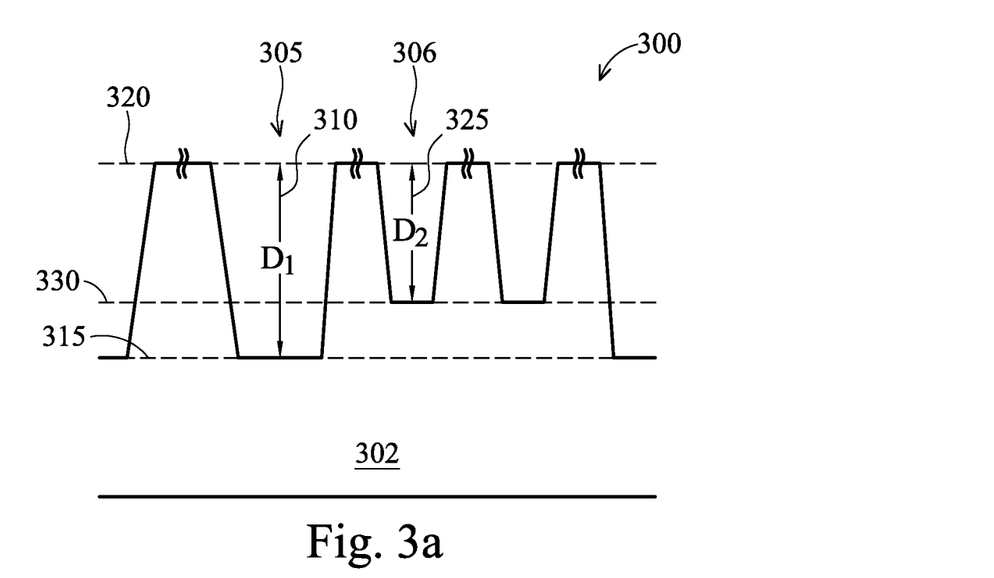
FIG. 3a is a side, cross-sectional view of a substrate of an integrated circuit, wherein the substrate includes a number of shallow trenches of two different depths formed on its top surface.

FIG. 3a illustrates a side, cross-sectional view of substrate 302 of integrated circuit 300. Substrate 302 includes a number of shallow trenches formed in its top surface, such as shallow trench 305 and shallow trench 306. A depth $D_1$ of shallow trench 305 (shown as interval 310) may be defined as a distance from a bottom of shallow trench 305 (shown as dashed line 315) to the top surface of substrate 302 (shown as dashed line 320), and a depth $D_2$ of shallow trench 306 (shown as interval 325) may be defined as a distance from a bottom of shallow trench 306 (shown as dashed line 330) to the top surface of substrate 302 (shown as dashed line 320).

As shown in FIG. 3a, the depths of the shallow trenches formed in integrated circuit 300 may differ. The depth of a shallow trench (of a pair of shallow trenches) may be set to a depth that is based on the requirements of semiconductor devices formed on the substrate between a pair of shallow trenches. For example, the depth of a shallow trench in a pair of shallow trenches may be determined based on device dimensions of the semiconductor devices formed on the substrate between a pair of shallow trenches, which may impact device density, with the semiconductor devices with the smallest device dimensions being formed on deepest shallow trenches. Additionally, the depth of a shallow trench may be determined based on current requirements of the semiconductor devices formed on the substrate between a pair of shallow trenches, with the semiconductor devices used with signal amplifiers being formed on the substrate between a pair of shallow trenches that are deeper than for semiconductor devices used in logic gates, for example. Additional semiconductor device properties that may impact the depth of a shallow trench may include application of the semiconductor device, semiconductor device width/height ratio (i.e., device geometry), junction voltage, threshold voltage, and so forth.

Within a single type of circuitry within an integrated circuit, such as in a logic core, embedded memory, analog circuitry, and so forth, shallow trenches of different depths may be used. For example, in an analog circuitry section of an integrated circuit, amplifiers may be formed on the substrate between a pair of shallow trenches that are relatively deep, while filters may be formed on the substrate between a pair of shallow trenches that are relatively shallow, and so on. Additionally, different types of circuitry may be formed on the substrate between a pair of shallow trenches of different depths. For example, a logic core may be formed over the substrate between a pair of shallow trenches of a first depth, while analog circuitry may be formed over the substrate between a pair of shallow trenches of a second depth, and so forth.

Furthermore, circuitry formed on the substrate between a pair of shallow trenches may share similar device characteristics. For example, semiconductor devices formed on the substrate between a pair of shallow trenches may have similar (or substantially equal) device dimensions, drive currents, threshold voltages, device density, and so forth. Therefore, within a single type of circuitry, if there are groups of semiconductor devices with device characteristics that differ by more than a specified margin, then the different groups of semiconductor devices may be formed on the substrate between different pairs of shallow trenches, where the different pairs of shallow trenches may have different depths. For discussion purposes, shallow trenches used by different groups of semiconductor devices may be referred to as group shallow trenches.

Alternatively, within a single type of circuitry within an integrated circuit, shallow trenches of a single depth may be used. The depth of the shallow trenches may be set to a value that provides a best performance for all semiconductor devices in the single type of circuitry.

Additionally, shallow trenches may be dedicated to a single type of circuitry. For example, if different types of circuitry within an integrated circuit may be formed on the substrate between a pair of shallow trenches of substantially equal depth, different shallow trenches with substantially equal depth may be used for the different circuitry types. Using different shallow trenches for different circuitry types even if they may have substantially equal depth may help to provide isolation for the different circuit types.

Figure 3B:
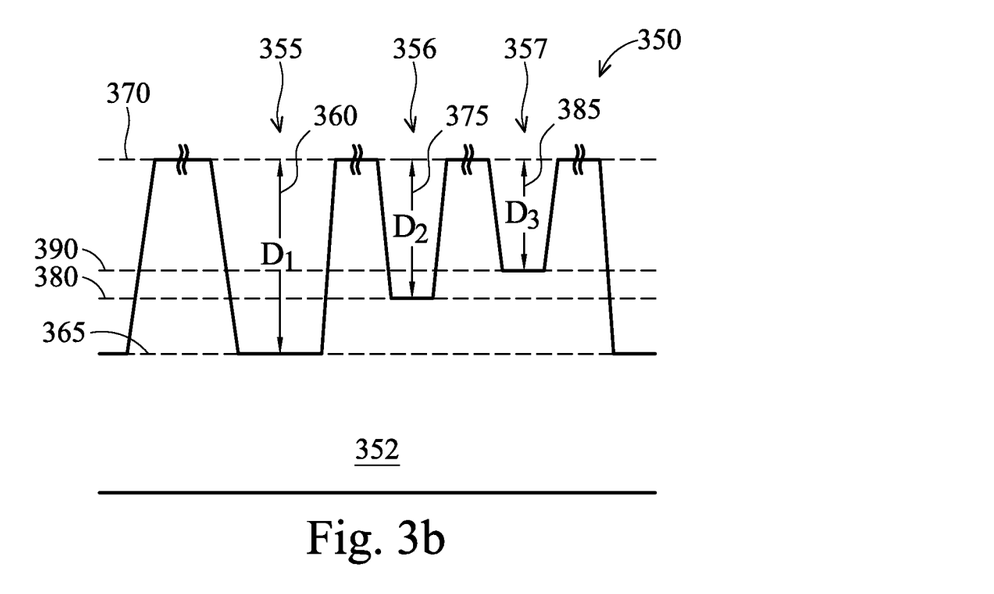
FIG. 3b is a side, cross-sectional view of a substrate of an integrated circuit, wherein the substrate includes a number of shallow trenches of three different depths formed on its top surface.

FIG. 3b illustrates a side, cross-sectional view of substrate 352 of integrated circuit 350. Substrate 352 of integrated circuit 350 includes a number of shallow trenches formed on its top surface, such as shallow trench 355, shallow trench 356, and shallow trench 357. As shown in FIG. 3b, integrated circuit 350 includes shallow trenches of three different depths: $D_1$ (interval 360 between top surface of substrate 352 (line 370) and bottom of shallow trench 355 (line 365)), $D_2$ (interval 375 between top surface of substrate 352 (line 370) and bottom of shallow trench 356 (line 380)), and $D_3$ (interval 385 between top surface of substrate 352 (line 370) and bottom of shallow trench 357 (line 390)).

The ability to use different shallow trench depths for different semiconductor devices may be able to enlarge the junction isolation window, enlarge the gap fill process window, and enlarge the CMP process window. Additionally, STI stress window may be relaxed.

Although the discussion focuses on integrated circuits having shallow trenches of two or three different depths, an integrated circuit may have shallow trenches of any number of different depths, with a limit being based on fabrication capability, desired performance gain, achievable performance gain, fabrication cost, fabrication yield, and so forth. Therefore, the discussion of integrated circuits with shallow trenches with two or three different depths should not be considered as being limiting to either the scope or the spirit of the embodiments.

Figure 4:
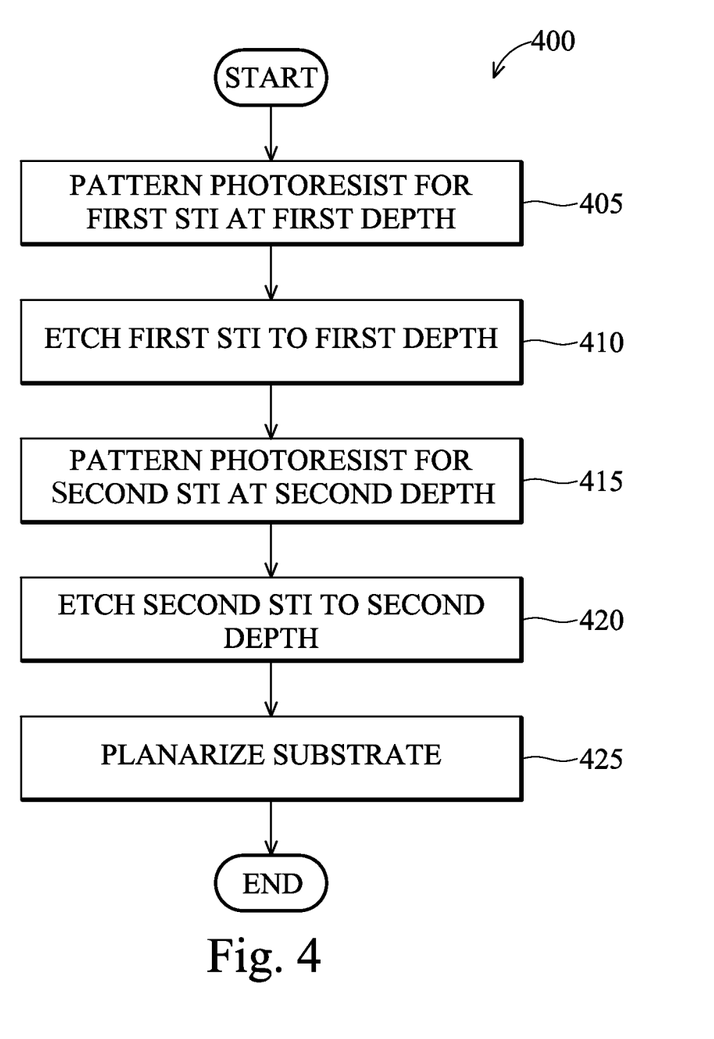
FIG. 4 illustrates a flow diagram of operations in creating shallow trenches of different depths on a substrate of an integrated circuit.

FIG. 4 illustrates a flow diagram of operations 400 in creating shallow trenches of different depths on a substrate of an integrated circuit. Operations 400 may be indicative of operations in the fabrication of an integrated circuit. Operations 400 may be a subset of operations in the fabrication of an integrated circuit, with operations potentially occurring before and after operations 400.

Operations 400 may begin with a creation of a first pattern for use in creating one or more shallow trenches, with each of the shallow trenches having substantially the same depth, i.e., a first depth (block 405). The pattern may be created by depositing a layer of photoresist (either negative or positive photoresist) on a substrate of an integrated circuit and then exposing the photoresist to a light that changes the properties of the photoresist. A mask (negative or positive depending on the type of photoresist being used) may be used to create the pattern on the photoresist. A wash may then be used to remove unwanted portions of the photoresist, leaving the pattern to be used in creating the shallow trenches.

Figure 5A:
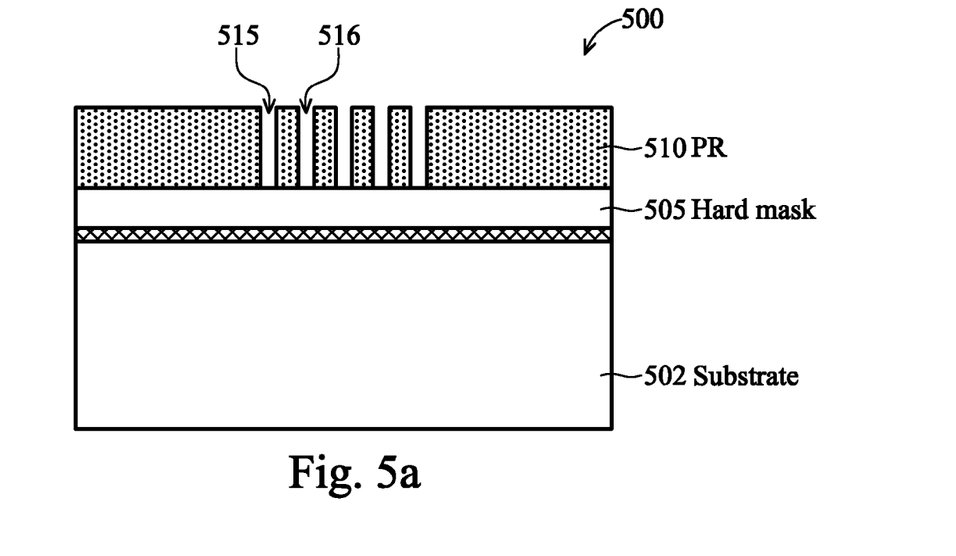
FIGS. 5a through 5d illustrate side, cross-sectional views of a substrate of an integrated circuit with shallow trenches created using operations shown in FIG. 4.

FIG. 5a illustrates a cross-sectional view of an integrated circuit 500. As shown in FIG. 5a, integrated circuit 500 may be undergoing fabrication and may be at a stage where shallow trenches are to be etched in a substrate 502 of integrated circuit 500. Substrate 502 may be covered with a hard mask 505, which may be a nitride layer, for example. Hard mask 505 may be used to protect substrate 502 from fabrication operations involved in the etching of shallow trenches in substrate 502 and subsequent CMP planarization operations.

Above hard mask 505 may be a photoresist layer 510. As shown in FIG. 5a, photoresist layer 510 has already been patterned, with openings, such as opening 515, opening 516, and so forth, in photoresist layer 510 corresponding to locations of shallow trenches, where the shallow trenches will all have substantially the same depth, i.e., the first depth.

Referring back to FIG. 4, the shallow trenches may then be etched into the substrate of the integrated circuit (block 410). The etching of the shallow trenches may be performed using any of a variety of standard substrate etching techniques, such as plasma etching at a variety of pressures, temperatures, and so forth.

Figure 5B:
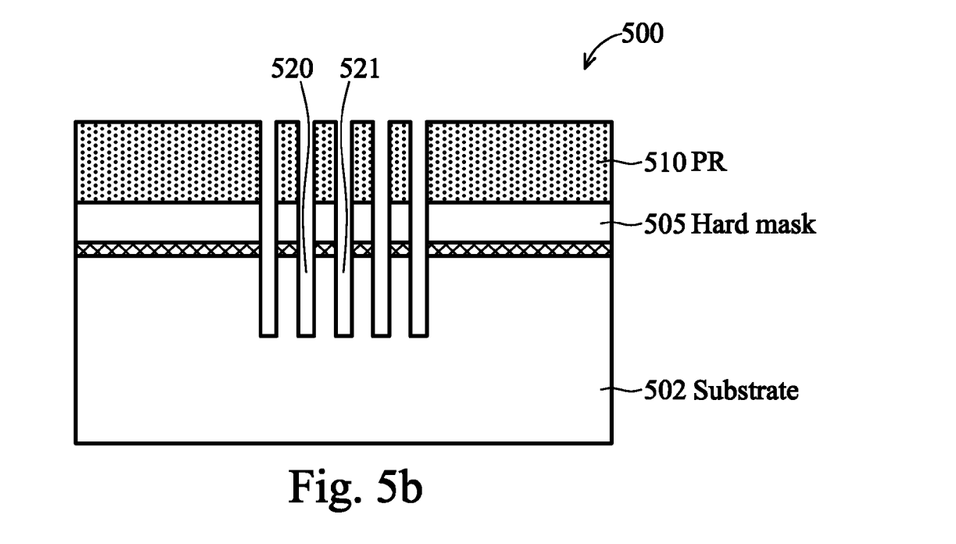

FIG. 5b illustrates a cross-sectional view of integrated circuit 500. As shown in FIG. 5b, integrated circuit 500 may be undergoing fabrication and may be at a stage where shallow trenches at a first depth, such as shallow trench 520 and shallow trench 521, have been etched into substrate 502. As discussed previously, the shallow trenches may be etched into substrate 502 by substrate etching techniques, such as plasma etching. The etching technique may also etch through hard mask 505. Since the shallow trenches are etched using the same etching process and at the same time, the shallow trenches all have substantially the same depth.

Figure 5C:
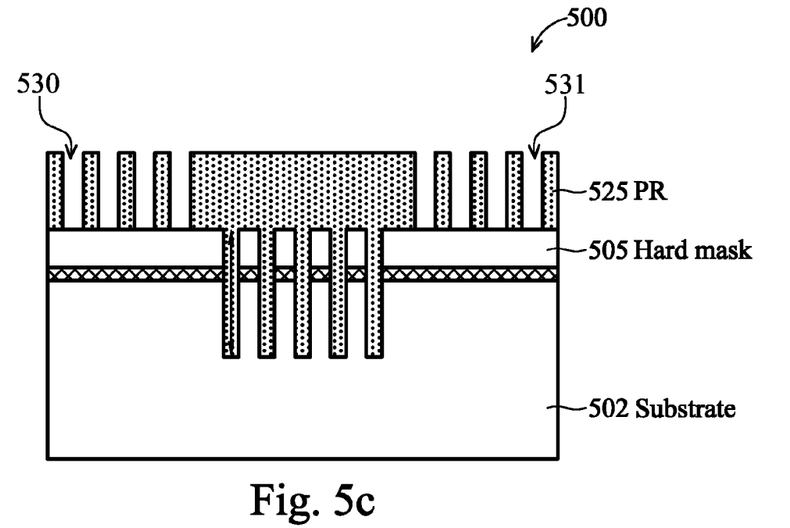

FIG. 5c illustrates a cross-sectional view of integrated circuit 500. As shown in FIG. 5c, integrated circuit 500 may be undergoing fabrication and may be at a stage where a photoresist layer 525 have been applied to integrated circuit 500 to protect the shallow trenches already created on substrate 502. Photoresist layer 525 may be applied to an entirety of substrate 502 and then patterned so that only portions of photoresist layer 525 over parts of substrate 502 with shallow trenches remain. A pattern has also been applied to photoresist layer 525, wherein the pattern is for use in creating shallow trenches of a second depth. The pattern includes openings 530 and 531 in photoresist layer 525. The openings in photoresist layer 525 may be removed with a photoresist strip and wash operation, for example.

Referring back to FIG. 4, with the shallow trenches at the first depth created, a second pattern for use in creating one or more shallow trenches having substantially the same depth, i.e., a second depth, may be created (block 415). Once again, a photoresist layer may be used to create the second pattern. With the second pattern created, the shallow trenches having the second depth may then be etched into the substrate (block 420). If additional shallow trenches are to be created in the integrated circuit, additional patterns may be created and additional etching operations may be repeated to create the additional shallow trenches.

Figure 5D:
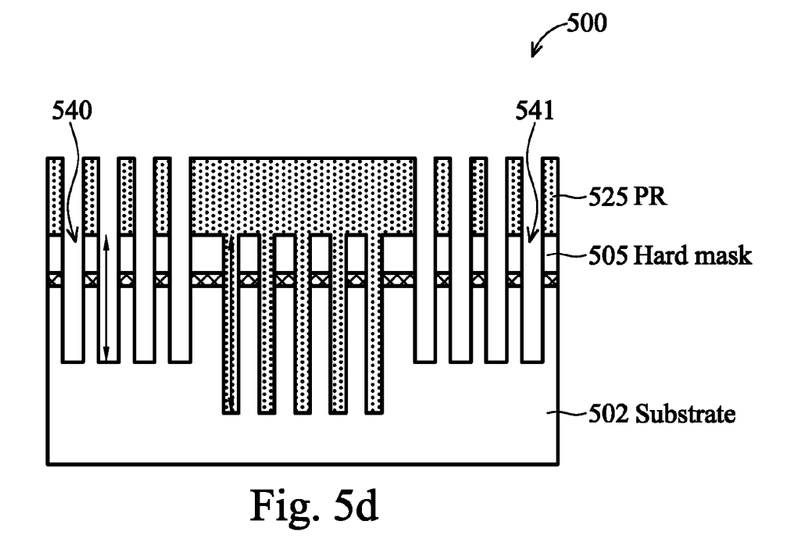

FIG. 5d illustrates a cross-sectional view of integrated circuit 500. As shown in FIG. 5d, integrated circuit 500 may be undergoing fabrication and may be at a stage where shallow trenches at a second depth, such as shallow trench 540 and shallow trench 541, have been etched in substrate 502.

Referring back to FIG. 4, after forming shallow trenches at a second depth, additional shallow trenches at a third depth, a fourth depth, and so on, may be formed by applying an additional photoresist layer (block 415, for example), patterning the photoresist layer (block 415, for example), and etching shallow trenches to a desired depth (block 420, for example) for each of the additional depths.

With the shallow trenches completed, the substrate may be planarized (block 425). Planarization of the substrate may be performed using a chemical mechanical polish (CMP). With the substrate planarized, operations 400 may terminate. After operations 400 terminates, the integrated circuit may continue with additional fabrication operations.

In an alternative embodiment, rather than performing a single CMP after all of the shallow trenches have been created in the substrate, a CMP operation may be performed after all of the shallow trenches for a single depth have been created. For example, a first CMP operation may be performed after the shallow trenches at the first depth have been etched (block 410) and a second CMP operation may be performed after the shallow trenches at the second depth have been etched (block 420).

Operations 400 as shown in FIG. 4 highlight some of the operations in the creation of the shallow trenches. A number of operations have been omitted for clarity purposes. For example, operations such as photoresist strip/clean, liner oxidation, shallow trench oxide fill, post CMP clean, and so forth, have been omitted.

Figure 6:
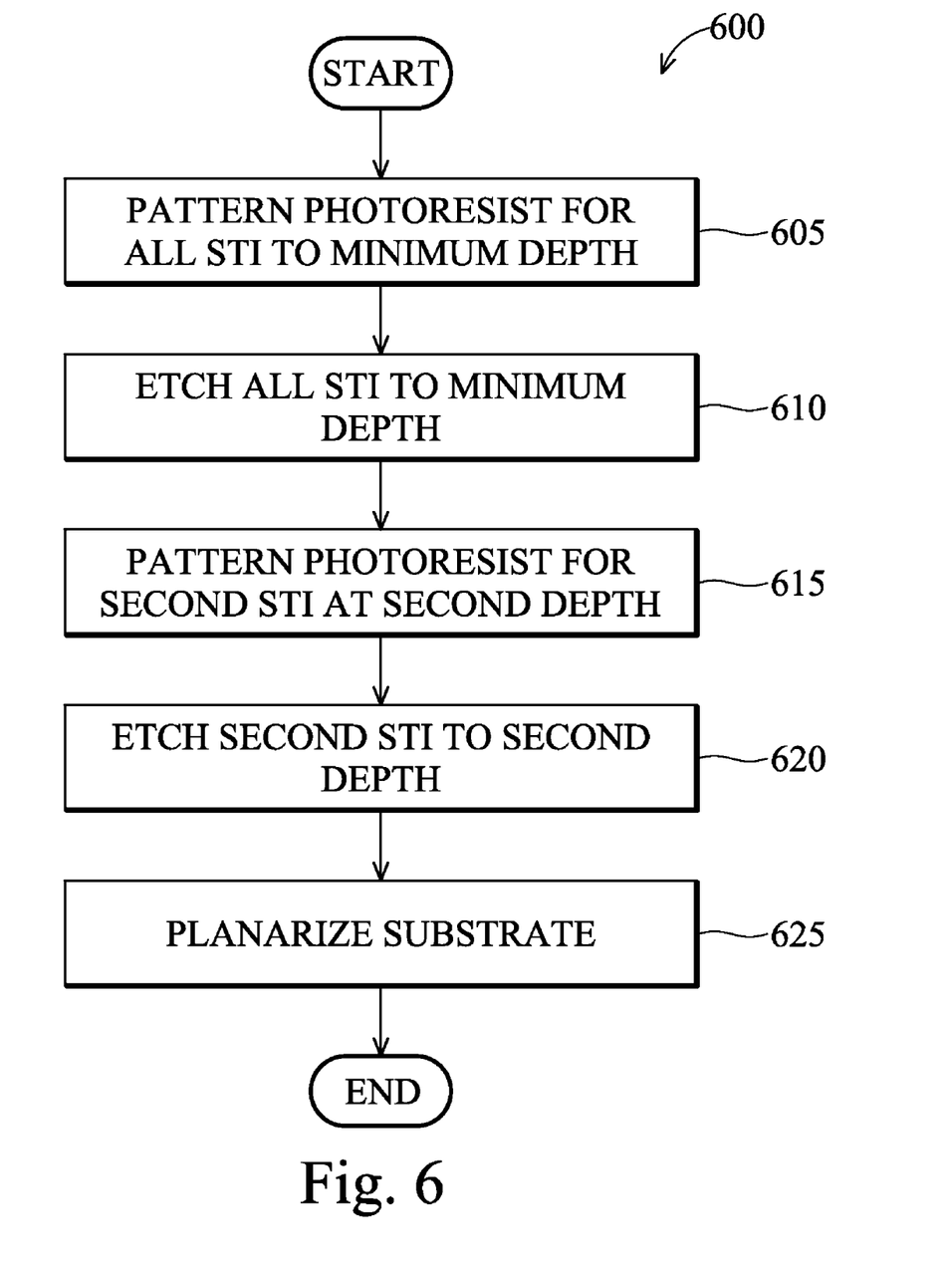
FIG. 6 illustrates a flow diagram of operations in creating shallow trenches of different depths on a substrate of an integrated circuit.

FIG. 6 illustrates a flow diagram of alternate operations 600 in creating shallow trenches of different depths on a substrate of an integrated circuit. Operations 600 may be indicative of operations in the fabrication of an integrated circuit. Operations 600 may be a subset of operations in the fabrication of an integrated circuit, with operations potentially occurring before and after operations 600.

Operations 600 may begin with a creation of a first pattern for use in creating one or more shallow trenches, with each of the shallow trenches having substantially the same depth, i.e., a first depth (block 605). The first pattern may be used in the etching of all shallow trenches in the integrated circuit, where all shallow trenches may be etched to the first depth, which may be a minimum shallow trench depth. The first pattern may be created by depositing a layer of photoresist (either negative or positive photoresist) on a substrate of an integrated circuit and then exposing the photoresist to a light that changes the properties of the photoresist. A mask (negative or positive depending on the type of photoresist being used) may be used to create the pattern on the photoresist. A wash may then be used to remove unwanted portions of the photoresist, leaving the pattern to be used in creating the shallow trenches.

Figure 7A:
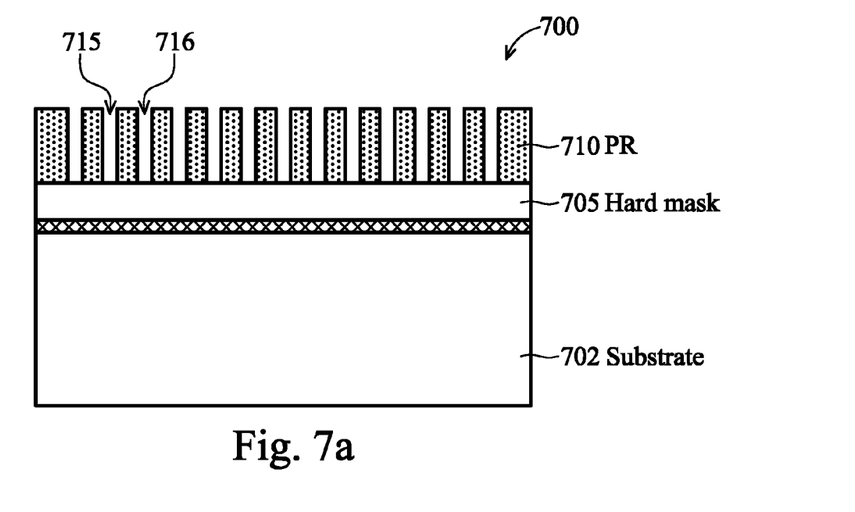
FIGS. 7a through 7d illustrate side, cross-sectional views of a substrate of an integrated circuit with shallow trenches created using operations shown in FIG. 6.

FIG. 7a illustrates a cross-sectional view of an integrated circuit 700. As shown in FIG. 7a, integrated circuit 700 may be undergoing fabrication and may be at a stage where shallow trenches are to be etched in a substrate 702 of integrated circuit 700. Substrate 702 may be covered with a hard mask 705, which may be a nitride layer, for example. Hard mask 705 may be used to protect substrate 702 from fabrication operations involved in the etching of shallow trenches in substrate 702 and subsequent CMP planarization operations.

Above hard mask 705 may be a photoresist layer 710. As shown in FIG. 7a, photoresist layer 710 has already been patterned, with openings, such as opening 715, opening 716, and so forth, in photoresist layer 710 corresponding to locations of shallow trenches, where the shallow trenches will all have substantially the same depth, i.e., the first depth.

Referring back to FIG. 6, the shallow trenches may then be etched into the substrate of the integrated circuit (block 610). The etching of the shallow trenches may be performed using any of a variety of standard substrate etching techniques, such as plasma etching at a variety of pressures, temperatures, and so forth.

Figure 7B:
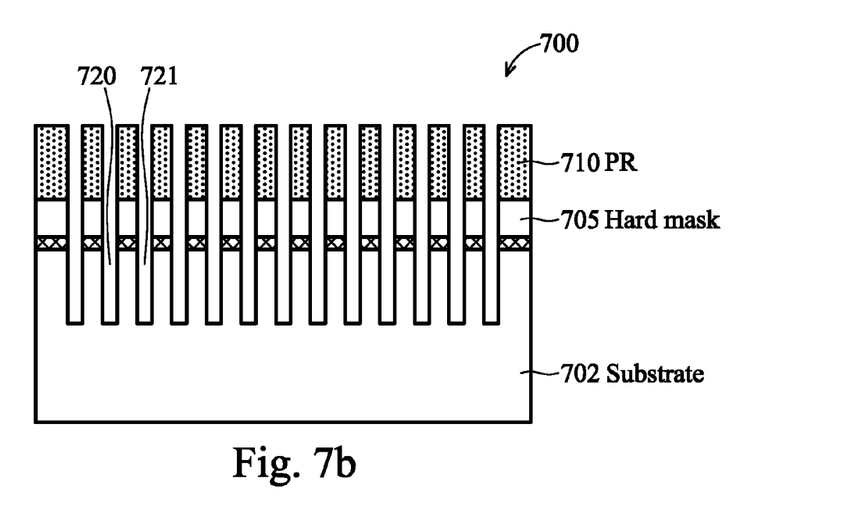

FIG. 7b illustrates a cross-sectional view of integrated circuit 700. As shown in FIG. 7b, integrated circuit 700 may be undergoing fabrication and may be at a stage where shallow trenches at a first depth, such as shallow trench 720 and shallow trench 721, have been etched into substrate 702. As discussed previously, the shallow trenches may be etched into substrate 702 by substrate etching techniques, such as plasma etching. The etching technique may also etch through hard mask 705. Since the shallow trenches are etched using the same etching process and at the same time, the shallow trenches all have substantially the same depth.

Figure 7C:
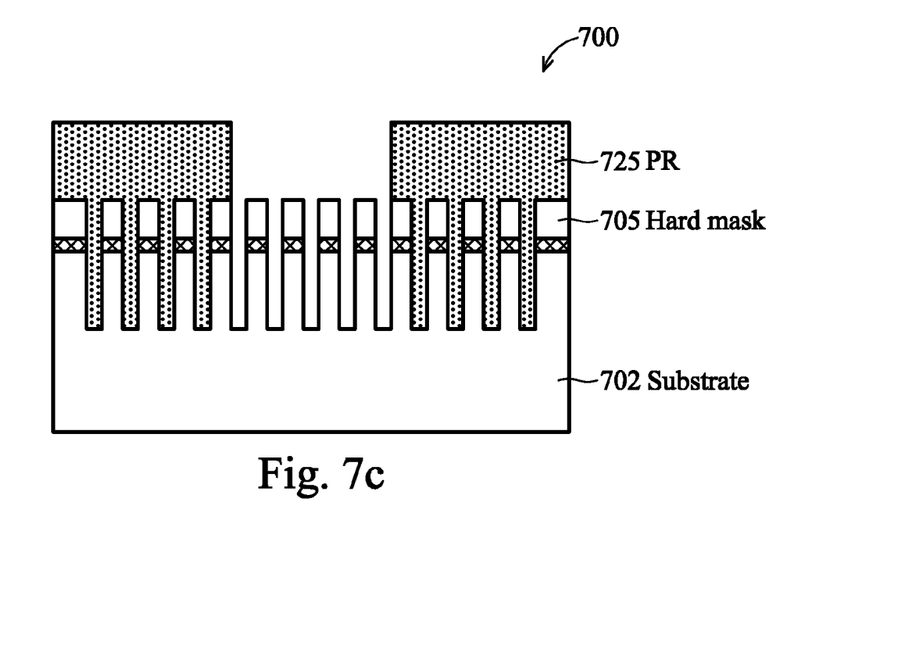

FIG. 7c illustrates a cross-sectional view of integrated circuit 700. As shown in FIG. 7c, integrated circuit 700 may be undergoing fabrication and may be at a stage where a photoresist layer 725 have been applied to integrated circuit 700 to protect the shallow trenches already created on substrate 702. Photoresist layer 725 may be applied to an entirety of substrate 702 and then patterned so that only portions of photoresist layer 725 over parts of substrate 702 with shallow trenches already at a desired depth remain. Other portions of photoresist layer 725 may be removed with a photoresist strip and wash operation, for example.

Referring back to FIG. 6, with the shallow trenches at the first depth created, a second pattern for use in deepening one or more shallow trenches already at the first depth to a second depth, may be created (block 615). Once again, a photoresist layer may be used to create the second pattern. With the second pattern created, the shallow trenches having the second depth may then be etched into the substrate (block 620). If additional shallow trenches are to be created in the integrated circuit, additional patterns may be created and additional etching operations may be repeated to create the additional shallow trenches.

Figure 7D:
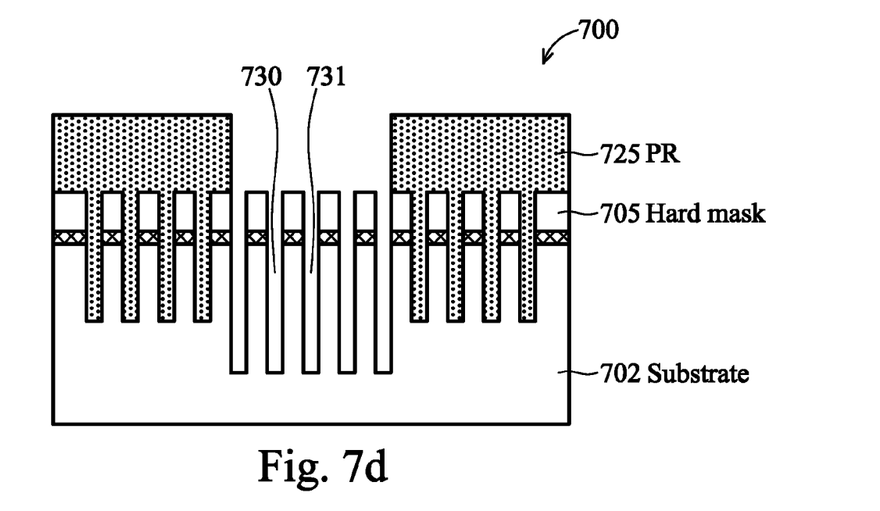

FIG. 7d illustrates a cross-sectional view of integrated circuit 700. As shown in FIG. 7d, integrated circuit 700 may be undergoing fabrication and may be at a stage where shallow trenches at a second depth, such as shallow trench 730 and shallow trench 731, have been etched in substrate 702. The shallow trenches at the second depth may have been formed by additional etching of shallow trenches at the first depth, wherein the first depth is less than the second depth.

Referring back to FIG. 6, after forming shallow trenches at a second depth, additional shallow trenches at a third depth, a fourth depth, and so on, may be formed by applying an additional photoresist layer (block 615, for example), patterning the photoresist layer (block 615, for example), and etching shallow trenches to a desired depth (block 620, for example) for each of the additional depths.

With the shallow trenches completed, the substrate may be planarized (block 625). Planarization of the substrate may be performed using a chemical mechanical polish (CMP). With the substrate planarized, operations 600 may terminate. After operations 600 terminates, the integrated circuit may continue with additional fabrication operations.

Although the embodiments and their advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for forming shallow trench isolation (STI) structures, the method comprising:
    applying a first photoresist layer on a top surface of a substrate, the top surface of the substrate having first planar portions and second planar portions, wherein the first planar portions are separate and laterally displaced from the second planar portions;
    patterning the first photoresist layer with a first pattern, the first pattern having a plurality of first openings exposing the first planar portions of the top surface of the substrate;
    etching a plurality of first STI structures from the top surface of the substrate to a first depth into the substrate using the first photoresist layer as a first mask;
    applying a second photoresist layer different from the first photoresist layer on the top surface of the substrate;
    patterning the second photoresist layer with a second pattern, the second pattern having a plurality of second openings exposing the second planar portions of the top surface of the substrate, wherein the second pattern does not expose any one of the plurality of first STI structures;
    etching a plurality of second STI structures from the top surface of the substrate to a second depth into the substrate using the second photoresist layer as a second mask, wherein each of the plurality of second STI structures corresponds to a different one of the second openings in the second pattern, and wherein each of the plurality of first STI structures is separate and laterally spaced from each of the plurality of second STI structures; and
    planarizing the substrate.

2. The method of claim 1, wherein the first depth and the second depth are different depths.

3. The method of claim 1, further comprising stripping the second photoresist layer.

4. The method of claim 1, further comprising:
    applying a third photoresist layer on the substrate;
    patterning the third photoresist layer with a third pattern; and
    etching a third STI structure into the substrate using the third photoresist layer as a third mask, the third STI structure having a third depth.

5. The method of claim 4, further comprising, prior to applying the third photoresist layer on the substrate, planarizing the substrate.

6. The method of claim 4, wherein the first depth, the second depth and the third depth are different depths.

7. The method of claim 1, wherein etching the first STI structure and etching the second STI structure comprise etching the substrate with a plasma etch.

8. The method of claim 1, further comprising, prior to applying the second photoresist layer, planarizing the substrate.

9. The method of claim 1, further comprising, prior to applying the first photoresist layer, applying a hard mask on the substrate, wherein the step of patterning the first photoresist layer with the first pattern further comprises patterning the hard mask with the first pattern having the first openings.

10. The method of claim 1, further comprising filling the first and the second STI structures with an oxide fill.

11. A method for forming shallow trench isolation (STI) structures, the method comprising:
    applying a first photoresist layer on a substrate;
    patterning the first photoresist layer with a first pattern;
    etching a first STI structure into the substrate using the first photoresist layer as a first mask, the first STI structure having a first depth;
    removing the first photoresist layer;
    applying a second photoresist layer on the substrate;
    patterning the second photoresist layer with a second pattern;
    etching a second STI structure into the substrate using the second photoresist layer as a second mask, the second STI structure having a second depth;
    removing the second photoresist layer;
    applying a third photoresist layer on the substrate;
    patterning the third photoresist layer with a third pattern;
    etching a third STI structure into the substrate using the patterned third photoresist layer as a third mask, the third STI structure having a third depth;
    removing the third photoresist layer; and
    planarizing the substrate.

12. The method of claim 11, further comprising, after etching the first STI structure into the substrate and prior to applying the second photoresist layer on the substrate, planarizing the substrate.

13. The method of claim 11, further comprising, after etching the second STI structure into the substrate and prior to applying the third photoresist layer on the substrate, planarizing the substrate.

14. The method of claim 11, wherein the first depth, the second depth and the third depth are different depths.

15. The method of claim 11, further comprising filling the first, the second and the third STI structures with an oxide fill.

16. The method of claim 11, further comprising, prior to applying the first photoresist layer on the substrate, applying a hard mask on the substrate.

17. A method for forming shallow trench isolation (STI) structures, the method comprising:
    applying a first photoresist layer on a substrate;

patterning the first photoresist layer with a first pattern;

etching all the STI structures into the substrate to a first depth using the patterned first photoresist layer as a first mask;

applying a second photoresist layer on the substrate;

patterning the second photoresist layer with a second pattern;

etching a first subset of the STI structures to a second depth using the patterned second photoresist layer as a second mask;

applying a third photoresist layer on the substrate;

patterning the third photoresist layer with a third pattern;

etching a second subset of the STI structures to a third depth using the patterned third photoresist layer as a third mask; and planarizing the substrate.

18. The method of claim 17, wherein the first depth, the second depth and the third depth are different depths.

19. The method of claim 17, further comprising filling all the STI structures with an oxide fill.

20. The method of claim 17, wherein the second subset of the STI structures is a subset of the first subset of the STI structures.

\* \* \* \* \*